(12) United States Patent
Dikken et al.

(10) Patent No.: US 10,333,411 B2
(45) Date of Patent: Jun. 25, 2019

(54) CONTROLLER FOR A SYNCHRONOUS RECTIFICATION MOSFET, A SWITCHED MODE POWER CONVERTER, AND A CONTROL METHOD

(71) Applicant: NXP B.V., Eindhoven (NL)

(72) Inventors: Jan Dikken, Nijmegen (NL); Jeroen Kleinpenning, Nijmegen (NL)

(73) Assignee: NXP B.V., Eindhoven (NL)

( * ) Notice: Subject to any disclaimer, the term of this patent is extended or adjusted under 35 U.S.C. 154(b) by 307 days.

(21) Appl. No.: 14/984,734

(22) Filed: Dec. 30, 2015

(65) Prior Publication Data
US 2016/0218627 A1 Jul. 28, 2016

(30) Foreign Application Priority Data

Jan. 26, 2015 (EP) .................................... 15152501

(51) Int. Cl.
*H02M 3/335* (2006.01)
*H03K 17/042* (2006.01)
(Continued)

(52) U.S. Cl.
CPC ... *H02M 3/33507* (2013.01); *H02M 3/33592* (2013.01); *H03K 17/04206* (2013.01);
(Continued)

(58) Field of Classification Search
CPC ......... H02M 3/33592; H02M 3/33569; H02M 3/1588; H02M 3/335; H03K 17/04206;
(Continued)

(56) References Cited

U.S. PATENT DOCUMENTS

| 5,946,207 | A | 8/1999 | Schoofs |
| 6,456,152 | B1 * | 9/2002 | Tanaka .................. G11C 5/145 327/536 |
| 2014/0218976 | A1 | 8/2014 | Luo et al. |

FOREIGN PATENT DOCUMENTS

| CN | 103378751 A | 10/2013 |
| CN | 103887980 A | 6/2014 |

OTHER PUBLICATIONS

NXP B.V. "NXP TEA1792TS, GreenChip Synchronous Rectifier Controller, Objective data sheet", XP05511397, 13 pgs.(Jun. 26, 2012).

(Continued)

*Primary Examiner* — Jue Zhang
*Assistant Examiner* — Lorena D Bruner

(57) ABSTRACT

There is disclosed a controller configured to control a synchronous rectification MOSFET having a drain, a source and a gate; the controller comprising a regulator configured to regulate a voltage between the drain and the source to a first regulation voltage, and a gate charger operable during a turn-on phase of the synchronous rectification MOSFET operation and configured to regulate a voltage between the drain and the source to a second regulation voltage having a larger absolute value than the absolute value of the first regulation voltage, wherein the gate charger is further configured to, when in operation, disable the regulator. Also disclosed is a switched mode power converter comprising such a synchronous rectification MOSFET, and a method for controlling such a synchronous rectification MOSFET.

15 Claims, 8 Drawing Sheets

(51) Int. Cl.
*H03K 17/16* (2006.01)
*H03K 17/30* (2006.01)

(52) U.S. Cl.
CPC ......... *H03K 17/166* (2013.01); *H03K 17/302* (2013.01); *H03K 2017/307* (2013.01); *Y02B 70/1475* (2013.01)

(58) Field of Classification Search
CPC ............... H03K 17/166; H03K 17/302; H03K 2017/307; Y02B 70/1475
USPC ........................................................ 323/127
See application file for complete search history.

(56) References Cited

OTHER PUBLICATIONS

Extended European Search Report for EP Patent Appln. No. 15152501.1 (dated Jul. 10, 2015).

* cited by examiner

CONTROLLER FOR A SYNCHRONOUS RECTIFICATION MOSFET, A SWITCHED MODE POWER CONVERTER, AND A CONTROL METHOD

CROSS-REFERENCE TO RELATED APPLICATIONS

This application claims the priority under 35 U.S.C. § 119 of European Patent application no. 15152501.1, filed on Jan. 26, 2015, the contents of which are incorporated by reference herein.

FIELD

The present disclosure relates to controllers for synchronous rectifiers in switch mode power converters. It also relates to power converter circuits having such controllers and synchronous rectifiers, and to methods of operating such controllers and circuits.

BACKGROUND

The efficiency of switch mode power converters (SMPC), also referred to as switch mode power supplies (SMPS), may be improved by replacing the diode conventionally used for rectification at an AC to DC output side of the converter by a switch, which is typically implemented as a MOSFET. By appropriately controlling the timing of the opening and closing of the switch, it can provide rectification—that is to say it may be used to block reverse currents, whilst allowing forward current to flow—without the forward voltage drop associated with a conventional rectification diode. Since the timing of such a switch is synchronised to the timing of the current, this is generally referred to as synchronous rectification.

In practice, the efficiency improvement associated with zero rectification losses is not fully achievable due to the voltage drop over the conducting channel of the synchronous rectification MOSFET, its gate charge, and the supply current required for the controller for the synchronous rectification.

Control of a synchronous rectification (or syncrec) MOSFET may be enhanced by regulating the voltage on its gate, such that the MOSFET operates in linear mode, rather than as a simple switch. For example, U.S. Pat. No. 5,946,207 discloses a synchronous rectifier for a flyback converter for improved switching timing and efficiency in which the gate of the FET is controlled from an amplifier which compares the drain-source voltage of the FET with the voltage of a reference voltage source.

A trade-off is normally required in a feedback loop including an amplifier and operating as a regulator, between a fast response time, which requires a relatively high open loop gain from the amplifier, and a stable operation, which requires a relatively low open loop gain from the amplifier.

SUMMARY

According to a first aspect of the present disclosure, there is disclosed a controller configured to control a synchronous rectification MOSFET having a drain, a source and a gate; the controller comprising a regulator configured to control the charge on the gate to regulate a voltage between the drain and the source to a first regulation voltage, and a gate charger configured to supply charge to the gate only during a turn-on phase of the synchronous rectification MOSFET operation, wherein the gate charger is further configured to, when in supplying charge, disable the regulator. By including a gate charger which supplies charge during part of the synchronous rectification operation, the restrictions imposed by the compromise between settling time and overshoot might be relaxed.

In one or more embodiments the gate charger is configured to supply charge to the gate to tend to regulate a voltage between the drain and the source to a second regulation voltage having a larger absolute value than the absolute value of the first regulation voltage. By thus making the amount of charge supplied to the gate dependent on the syncrec MOSFET's drain-source voltage, it may be possible to ensure that the gate is charged, during turn-on, to an appropriate level for the amount of current which the syncrec MOSFET is required to conduct, since the syncrec MOSFET's drain-source voltage acts as a proxy for the required current conduction level. Such a configuration also may allow the gate charger to be designed to be functionally similar to one half—that is to say, the pull-up or charging part—of the regulator. And since in these embodiments, the second regulation voltage has a larger absolute value than the absolute value of the first regulation voltage, there is a larger off-set between the regulation point and a local ground: this may allow for stronger or larger (negative) control signals, voltages and/or currents, which may thereby provide for faster control. So although the gate charger only charges and does not discharge the gate, (in other words the charging current from the gate charger cannot be negative, whereas the regulator can provide a negative charging current to discharge the gate), faster control allows the charging current to be switched off faster—thereby reducing overshoot or overcharging which might otherwise result from the charge which continues to flow while the charging current is being reduced to zero. To that extent, the gate charger may not be able to fully regulate the syncrec MOSFET's drain-source voltage, but does "tend to" regulate it.

In other embodiments, particularly where it may be known in advance the level of current that the syncrec MOSFET is required to conduct once it is turned on, the gate charger may supply a predetermined, or fixed, charge to the gate, for instance from a pre-charged capacitor, or a constant, but gated, current source.

In one or more embodiments, the first regulation voltage is between 10 mV and 100 mV, or between 40 mV and 60 mV. The first regulation voltage may typically be 50 mV. Having a regulation voltage close to zero may enable efficient regulation, without having to move unnecessary charge, once the regulation control point has been reached or closely approached.

In one or more embodiments, the second regulation voltage is between 100 mV and 500 mV, or between 300 mV and 400 mV. The second regulation voltage may typically be 350 mV. Having a second regulation voltage which is higher than the first voltage may enable the gate to approach or reach the regulation control point with reduced or minimum delay.

In one or more embodiments, the gate charger is configured to start operating when a voltage between the drain and the source starts to exceed half or about a half a forward (knee) voltage of the MOSFET's back gate diode. Thus operation of the gate charger may conveniently be achieved without requiring additional circuitry to determine an appropriate start-time. Typically the forward voltage of the MOSFET back gate diode may be approximately 700 mV.

In one or more embodiments, the gate charger is operable only when a back gate diode of the synchronous rectification MOSFET is conducting. This may allow for the regulator to provide regulation at other times, in particular when the MOSFET channel is conducting, and when the gate of the syncrec MOSFET is being discharged.

In one or more embodiments, the regulator and gate charger each comprise a feed-back loop, and the open loop gain of the feedback loop of the gate charger is larger than the open loop gain of the feedback loop of the first regulator.

In one or more embodiments, the controller is a controller for a switched mode power converter, and further comprises a power switch control unit configured to control the switching of a power switch of the switch mode power converter. Synchronous rectification with relatively high efficiency may be important for switch mode power converters such as switch mode power supplies; however, in other embodiments, the syncrec MOSFET may be used elsewhere, for instance in a linear supply in which syncrec MOSFETs may replace the conventional diode bridge on the secondary side. Similarly, the syncrec MOSFETs may form an active bridge rectifier at a primary side of a SMPS, or in a non-isolated supply.

According to another aspect of the present disclosure, there is provided a switch mode power converter comprising a power switch, a synchronous rectification MOSFET and a controller as claimed in any preceding claim configured to control at least the synchronous rectification MOSFET.

In one or more embodiments, the power converter is a resonant converter.

According to another aspect of the present disclosure there is disclosed a method of controlling a synchronous rectifier in a Switched Mode Power Converter, having a drain, a source and a gate, and incorporating a back gate diode, the method comprising: regulating a voltage between the drain and the source to a first regulation voltage by means of a first regulator; regulating a voltage between the drain and the source to a second regulation voltage having a larger absolute value than the absolute value of the first regulation voltage during a turn-on phase of the synchronous rectification MOSFET operation, by means of a gate charger; and disabling the first regulator whenever the gate charger is in operation.

In one or more embodiments, regulation by the gate charger commences when a voltage between the drain and the source starts to exceed half, or about a half, a forward voltage turn-on of a back gate diode of the MOSFET.

In one or more embodiments, regulating voltage between the drain and the source to a first regulation voltage comprises regulating the voltage to between −40 mV and −60 mV. Similarly, in one or more embodiments, tending to regulate the voltage between the drain and the source to a second regulation voltage comprises tending to regulate to a voltage which is between −300 mV and −400 mV.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

Figure 1:
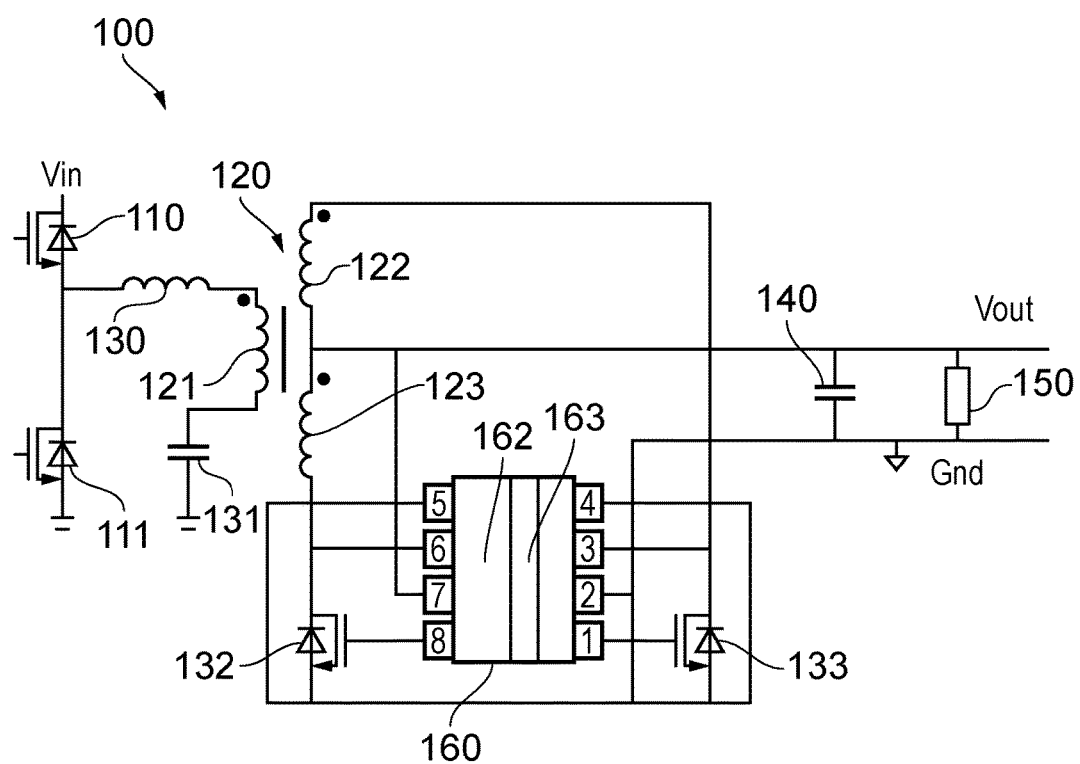
FIG. 1 shows, schematically, a resonant converter including two synchronous rectification MOSFETs.

It should be noted that the figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments

DETAILED DESCRIPTION OF EMBODIMENTS

FIG. 1 shows a switch mode power converter 100, in this case a resonant converter. The converter includes two power MOSFETs 110 and 111, which alternately open and close in opposition, in order to periodically connect the primary side winding 121 of a transformer 120 to an input voltage Vin. The primary side winding 121 is connected to ground via a resonant tank capacitor 131, forming part of the resonant tank. In this example, the output side comprises secondary windings 122 and 123 of the transformer 120. Each secondary winding is connected to the output via a respective synchronous rectifier MOSFET 132 and 133. The synchronous rectifier MOSFETs 132, 133 are controlled by respective controllers 162 and 163, which in this case are implemented in the same integrated circuit 160. The output circuit includes an output capacitor 140 and may, as shown, have a load across the output at 150.

Figure 2A:
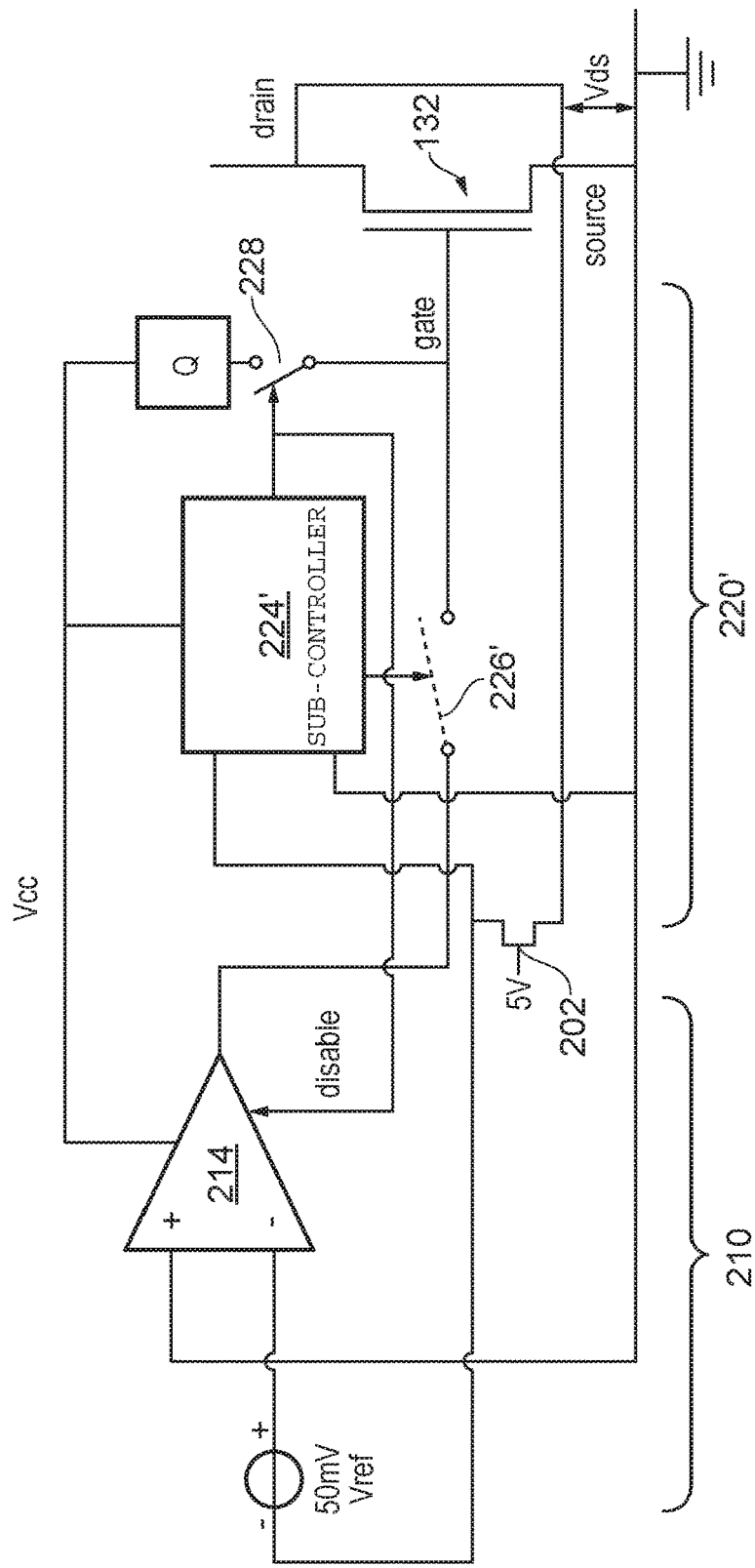
FIG. 2(a) shows a schematic of a controller according to one or more embodiments.

A controller according to one or more embodiments is shown in FIG. 2(a). The controller has two sections: a normal, or first, regulator 210; and a gate charger, 220'; the first regulator can operate during both changing and discharging, whereas the gate charger may operate to supply charge during only the charge or turn-on phase, as will be discussed in more detail below.

The first regulator operates in a generally conventional way as a continuous regulator: it attempts to regulate the gate of the MOSFET to ensure that a constant voltage Vds between its drain and source, for example −50 mV, is established. When increasing current flows from source to drain in a forward direction the regulator pushes the gate to a more positive voltage, to maintain Vds at the regulation voltage Vref—in this case 50 mV. Thus in case the current is small, the gate will be charged to only a little bit above the threshold voltage of the MOSFET; in case of increased current the gate is further charged: as a result, energy is not wasted in charging the gate unnecessarily.

The skilled person would appreciate that first regulator is not completely conventional, in the sense that it is implemented with an input stage that in principle has no slew rate limitation, whereas slew rate limitation may generally be expected to be used in conventional regulators: as a result, in a conventional input stage the maximum output current that can be supplied by the input stage of the first regulator is equal to a tail current of a differential input pair. Thus the regulator can provide more output current with larger input voltage and initially this relationship is even exponential, after which it is limited by series resistances and limited current amplification factors. So, when the input voltage is made larger, more current is available. The charging of the regulator may thus be very fast during diode conduction, where the input voltage is several hundreds of millivolts, but this is not so much the case for regulating itself off, because in that case there is not so much current available, because its input voltage is then much smaller—typically only tens of millivolts.

If this regulator were to be used throughout the whole of the rectification cycle, one or more problems may arise. For example: at the beginning of rectification cycle the gate of the syncrec MOSFET will be at or less than zero; it may have been pushed negative by its capacitive coupling to the drain. The source is at ground level, and the drain is negative by a voltage corresponding to its body diode—that is to say, the drain voltage is constrained to be the same as the body (also known as the back gate) diode, since the drain is connected and thus tied to the cathode of the body diode, and the source is connected to the anode of the body diode. The regulator thus has a large offset from its control point and thus a large drive to develop high currents to charge the gate of the syncrec MOSFET. So the charging capability is large—which may be problematic since it keeps on charging the gate until the MOSFET has regulated on sufficiently such that Vds has reached the regulation level Vref (for instance −50 mV). At this point, charging of the gate should be stopped instantaneously, but this cannot happen due to factors such as internal parasitic capacitances. The result of the excess charge on the gate could be significant overshooting of the gate voltage, leading to undesirable gate drive losses.

Thus, a gate charger is provided. The gate charger is configured to operate during a turn-on phase of the synchronous rectification MOSFET, and to disable the regulator when it is charging the gate. The gate charger may, as shown in FIG. 2(a) comprise a sub-controller 224', which monitors Vds, and in case that Vds is more negative than a second regulation voltage, to supply charge from a charge source Q to the gate of the syncrec, for instance by closing or toggling a switch 228. Q may be, for instance a capacitor and may be supplied from a supply voltage Vcc, as shown. Thus the gate charger may, for instance, supply a predetermined, or fixed, charge to the gate by closing the switch, for instance from a pre-charged capacitor, or a constant, but gated, current source by toggling the switch.

When the gate charger is supplying charge, the sub-controller disables the regulator, for instance by a "disable" signal as shown, which may either be tied to the control for the switch 228 or be a separate control output (not shown) from the sub-controller. Alternatively, in some embodiments the regulator may be disabled by disconnecting its output to preventing it from supplying charge to the synrec gate—for instance by switch 226' as shown; in such an embodiment, the regulator should be designed carefully to avoid being turned hard on when its output is disconnected, or otherwise to prevent the first regulator from supplying charge at a high rate immediately it is no longer disabled—that is to say, once the gate charger has stopped supplying charge.

Figure 2B:
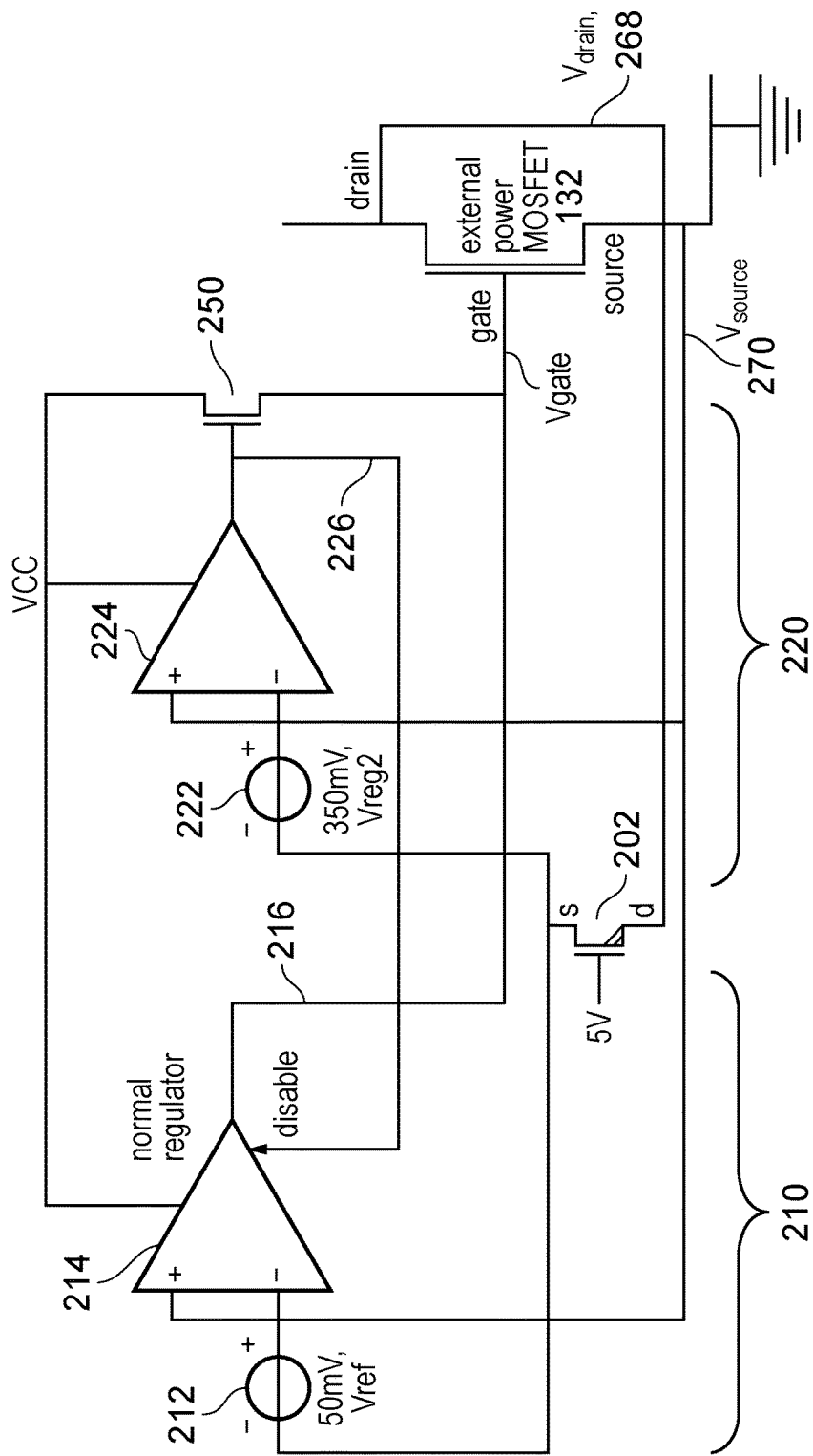
FIG. 2(b) shows a schematic of another controller according to one or more embodiments.

A controller according to one or more embodiments is shown in FIG. 2(b). Similarly to FIG. 2(a), the controller has two sections: a normal regulator 210, such as that already described and which shall hereinbelow be considered as a "first" regulator; and a gate charger, which in this case is implemented as a turn-on, or second, regulator 220; the first regulator can operate during both charging and discharging, whereas the gate charger may operate during only the charge or turn-on phase, as will be discussed in more detail below. It will be appreciated that whereas the gate charger may operate only during the charge or turn-on phase, it need not necessarily be disabled at other times; in a design such as that shown in FIG. 2(b), the gate charger may continually monitor Vds, but only operates, in the sense of supplying an output to charge the gate, when Vds is more negative than a second regulation voltage (as discussed in more detail below).

In these embodiments, the gate charger is operable during a turn-on phase of the synchronous rectification MOSFET and is configured to tend to regulate Vds to a second regulation voltage having a larger absolute value than the absolute value of the first regulation voltage. The gate charger is further configured to, when in operation, disable the first regulator.

By having a high regulation voltage, this gate charger is better able to charge the gate of the syncrec MOSFET to an appropriate value without too much overshoot. The gate charger is active during a turn-on phase which may be while the back gate diode of the MOSFET is conducting. The regulation voltage Vreg2 for the gate charger may be typically between 100 mV and 500 mV, or between 300 mV and 400 mV, or as shown 350 mV. More particularly the regulation voltage may be approximately equal to half a diode turn-on voltage—that is to say the knee of the diode's VI curve. The gate charger may have the same capability as the first regulator to develop large currents for charging and discharging, depending on the excursion of Vds from its regulation level; however by having a larger (absolute) regulation voltage, the capability to develop large internal currents to stop charging is enhanced relative to a regulator—such as the first regulator—wherein the level is close to 0.

The gate charger is operable during a turn on phase, typically while the syncrec drain voltage (Vds) is lower, that is to say more negative, than −350 mV; (equal to Vd/2, where Vd=700 mV is the back gate diode voltage during forward conduction of the back gate of the syncrec MOSFET), during which turn-on phase the regulator is disabled. The charge on the syncrec gate will reach Vth (in order for the syncrec to open sufficiently to limit its Vds to 350 mV). The regulator then takes over control, and provides regulation with the gate voltage Vgate being Vth<Vgate<Vmax; Vmax may typically be 12V.

Whereas the gate charger is operable during a turn on phase, it might not operate throughout the entirety of the transition during which the synchronously rectifier is turning on, or the entirety of the start of the rectification cycle, as will now be described:

At the start of the rectification cycle, the drain voltage falls from a positive value fast until the drain becomes negative by one diode voltage and the internal (back gate, or body) diode of the syncrec MOSFET starts to conduct. Then, the first regulator becomes active, starting to charge the gate from the moment the drain becomes more negative than the regulation level of that regulator (Vref, for instance −50 mV). But the drain becomes negative so fast, that it will become lower than the regulation level (Vreg2) of the gate charger, before the power MOSFET is regulated on hard enough to prevent it from going deeper. The gate charger now becomes active and disables the first regulator. It will start charging the gate of the power MOSFET. The regulation will be handed over to the first regulator when the gate charger has pulled the gate of the power MOSFET enough above its threshold, such that its Vds has become smaller than about half a forward voltage of a diode (Vd/2), as will be explained in more detail hereinbelow—that is to say Vreg2=Vd/2. From that moment on the gate charger starts to regulate itself off again. While it regulates itself off, the first regulator is enabled again and takes over the regulation.

Ideally, the gate charger would stop its charging activity infinitely quickly so as to instantly stop charging the gate once Vds reaches the reference level, (which, as already mentioned, is typically set to minus one half a diode forward voltage). However, delays will generally keep the charging on for slightly longer, such that the first regulator will take over slightly later, preferably exactly at the point where the |Vds| of the power MOSFET has decreased to the regulation level of the first regulator. However, deviation from this moment is accommodated by the normal regulation of the first regulator: when the charging of the gate is stopped earlier than this ideal moment, it will take a while for the first regulator to charge the gate further to decrease the |Vds| to its regulation level. When the charging of the gate is stopped later than this ideal moment, the first regulator will discharge the gate to increase the |Vds| to the regulation level.

Turning back to FIGS. 2(a) and 2(b), it can be seen that the first charge regulator 210 includes a voltage source 212 for providing the regulation voltage Vref relative to the syncrec MOSFET drain voltage on line 268, which as shown may be 50 mV, and acts as a first input to a trans-conductance amplifier 214. That is to say, the first input to the trans-conductance amplifier is equal to Vdrain +Vref (in this case (Vdrain+50 mV). The first input is switchably disconnectable by a protection switch 202. The switch 202 may be implemented as a transistor, and acts as a shutter switch to keep away higher voltages than its gate voltage from the input of the amplifier. The second input to the trans-conductance amplifier is the syncrec MOSFET source voltage (Vsource) 270. The trans-conductance amplifier output current on output line 216 is applied to the gate of the syncrec MOSFET. Typically, the output current on line 216 is directed to the syncrec MOSFET through an output stage. In order to more clearly illustrate the embodiment, the output stage is not shown. The output stage would be familiar to the skilled person.

Considering FIG. 2(b), the gate charger 220 of the controller 200 includes a second voltage source 222, providing the second regulation voltage relative to the syncrec MOSFET drain (Vdrain), and being the first input to a trans-conductance amplifier 224. Thus the second regulation voltage is Vreg2, which in this case is 350 mV. The second input to the trans-conductance amplifier 224 is the syncrec MOSFET source 270. The output on line 226 from the trans-conductance amplifier controls the gate of a gate charge transistor 250, whose output charges the gate of the syncrec MOSFET from the power rail Vcc. The output on line 226 from the trans-conductance amplifier 224 is also provided to the trans-conductance amplifier 214 of the first regulator, as a blanking input in order to disable the first regulator when the gate charger is providing regulation. By using the output of the trans-conductance amplifier 224 to open a further transistor 250, which supplies charge onto the syncrec gate, it is explicitly shown that the gate charger only charges the syncrec gate, and does not discharge it. In contrast, the output from the first regulator 214 may both charge and discharge the syncrec gate, according to whether the output is positive or negative. The skilled person will appreciate that in some embodiments, the depiction of the first regulator in FIGS. 2(a) and 2(b) is schematic only, and the regulator may be implemented as two comparators or trans-conductance amplifiers (not shown), the output from the first of which controls the gate of a transistor between the voltage supply and the syncrec gate, and the output from the second of which controls the gate of a transistor between the ground and the syncrec gate. The first of these two transistors thus provides for charging the syncrec gate, and the second of the transistors provides for discharging the syncrec gate. The similarity, in one or more embodiments, between the gate charger and the charging part of the regulator is thus apparent, and so the gate charger may loosely be described as a 'turn-on regulator'.

Both trans-conductance amplifier 214 and trans-conductance amplifier 224 may be provided from the supply rail Vcc. In other embodiments, and in particular in case that Vcc is higher than 12V the supply to the trans-conductance amplifiers may be provided via an extra internal regulator that provides a maximum supply voltage of 12V. Transistor 250 may be directly connected to Vcc with its drain.

Figure 3:
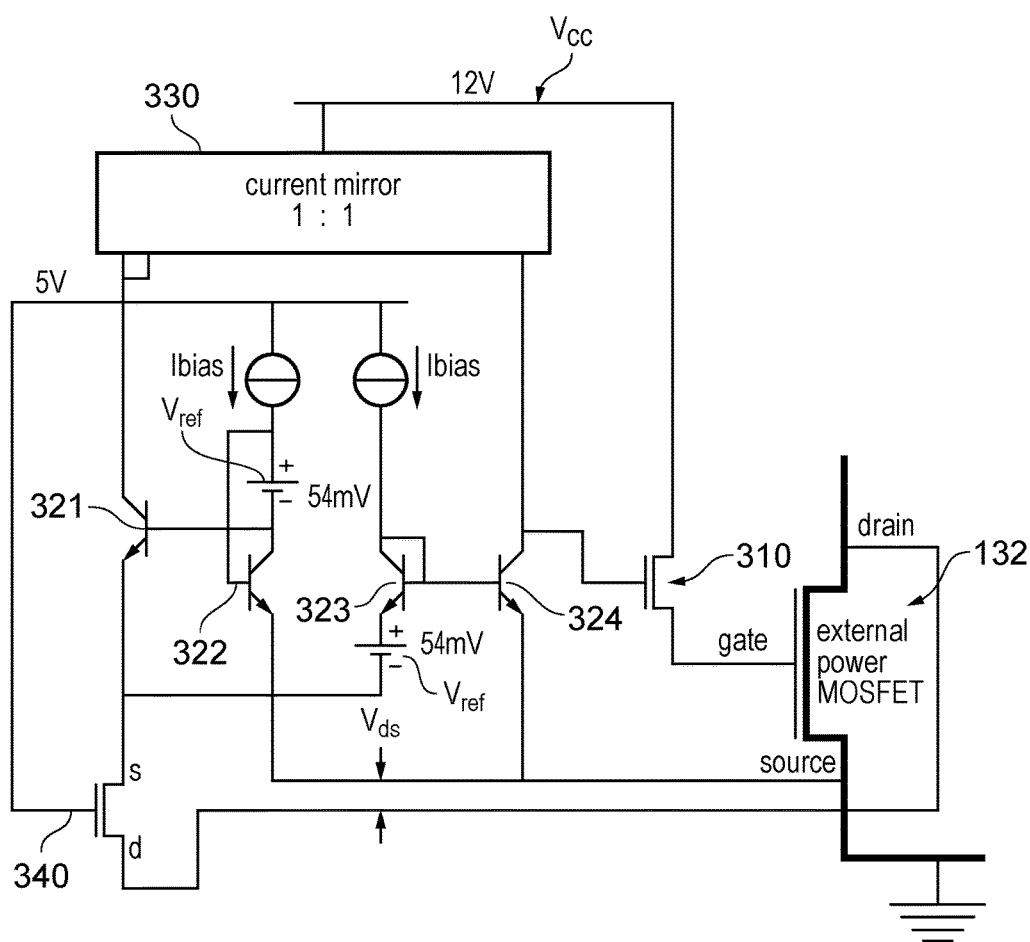
FIG. 3 shows a circuit diagram of a, pull-up, part of a regulator according to one or embodiments.

FIG. 3 shows a partial circuit diagram of a regulator for controlling a synchronous rectifier (or syncrec) MOSFET 132, such as may be used as part of the first regulator in the embodiment shown in FIGS. 2(a) and 2(b). The regulator comprises a feedback amplifier, which tries to regulate the gate of the MOSFET 132 to maintain a maximum drain-source voltage Vds. To do this, the regulator controls the voltage on the gate of a gate charge MOSFET 310. Gate charge MOSFET 310 controls the charge supplied from the supply line Vcc (which may be as shown in this case at 12V), to the gate of the syncrec MOSFET 132. Note that FIG. 3 shows only the pull-up part of the regulator and can only charge the gate of the syncrec MOSFET; a similar circuit shown in FIG. 4 and discussed hereinbelow, carries out the pull-down part.

The target drain-source voltage Vds is defined by the reference voltage, Vref which may be as shown in FIG. 3, 54 mV. Bipolar transistors 321, 322, 323 and 324 are arranged, together with current mirror 330, as a variable trans-conductance which has little slew rate limitation and has a rail-to-rail capability at the output, to provide an output current to drive the gate of buffer transistor 310. In one or more embodiments, the output is used to limit the loop gain and the buffer transistor 310 is the output transistor of another current mirror with a lot of current gain (not shown). The output from buffer transistor 310 drives the gate of the syncrec MOSFET.

The trans-conductance amplifier includes bias currents Ibias, which are the currents that run in every branch of the input stage when the inputs are at the regulation level and the output is between the supply and ground. They are normally required for the proper working of the transistors to provide the starting point for the output currents to develop when the differential input voltage deviates from the regulation level. When the trans-conductance amplifier has input at the regulation level it has zero output current and the output voltage will not change and will be stable between supply and ground.

The reverse voltage of a vertical bipolar transistor is usually limited to about 5V, because when as a result of breakdown too much reverse current would flow across its base-emitter junction, its current amplification factor can deteriorate significantly. So transistor 340 is included between the drain and the trans-conductance amplifier: transistor 340 is a high voltage transistor which protects the drain voltage of the syncrec MOSFET from reaching the emitter of the transistor in the trans-conductance amplifier, if it goes higher than the gate of transistor 340. When the drain goes lower than the gate of transistor 340 minus a threshold, the drain voltage is passed to the emitters. The lower the drain goes, the lower the resistance of transistor 340 becomes.

Figure 4:
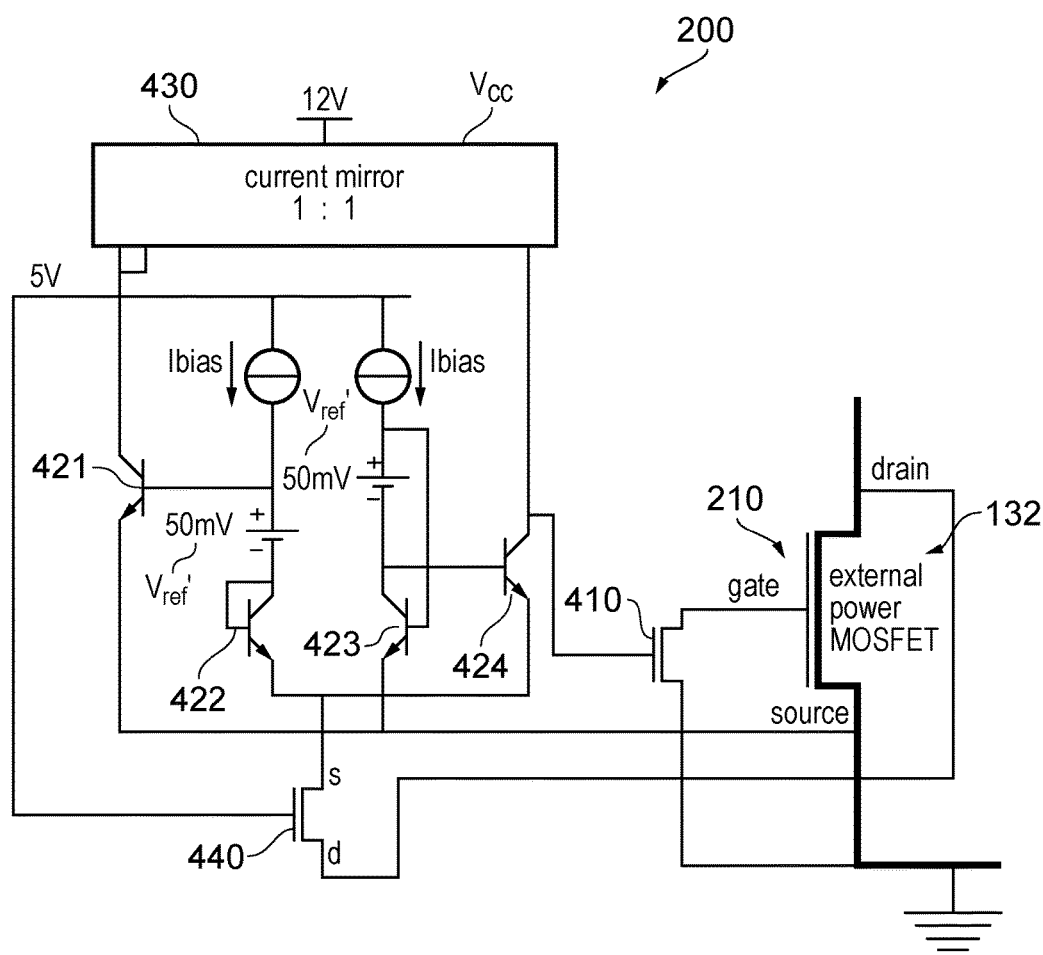
FIG. 4 shows a circuit diagram of another, pull-down, part of a regulator according to one or embodiments.

FIG. 4 shows a pull-down part of the first regulator. The circuit is similar to the pull-up part shown in FIG. 3, in that the target for drain-source voltage Vds is defined by the reference voltage Vref' which may be, as shown in FIG. 4, 50 mV. Bipolar transistors 421, 422, 423 and 424 are arranged, together with current mirror 430, as a variable trans-conductance which has little slew rate limitation and has a rail-to-rail capability at the output, to provide an output to drive the gate of gate discharge MOSFET 410, which may be similar to the gate charge MOSFET 310 used in the pull-up part shown in FIG. 3; alternatively it may be different, since it can have a lower breakdown voltage, because it sees a maximum voltage of 12V. Similarly, the high voltage transistor 440 used to protect the bipolar transistors in the trans-conductance amplifier may be same as the high voltage transistor (340) used for the pull-up part. Preferably the pull down part should have a regulation level (Vref') which is a little bit higher (that is to say, smaller in the absolute sense), for example −50 mV than the regulation level Vref=−54 mV of the pull up part, to prevent cross conduction currents as a result of both acting at the same time. To that extent, FIG. 2 shows a simplified schematic (with a single value Vref=−50 mV).

Figure 5:
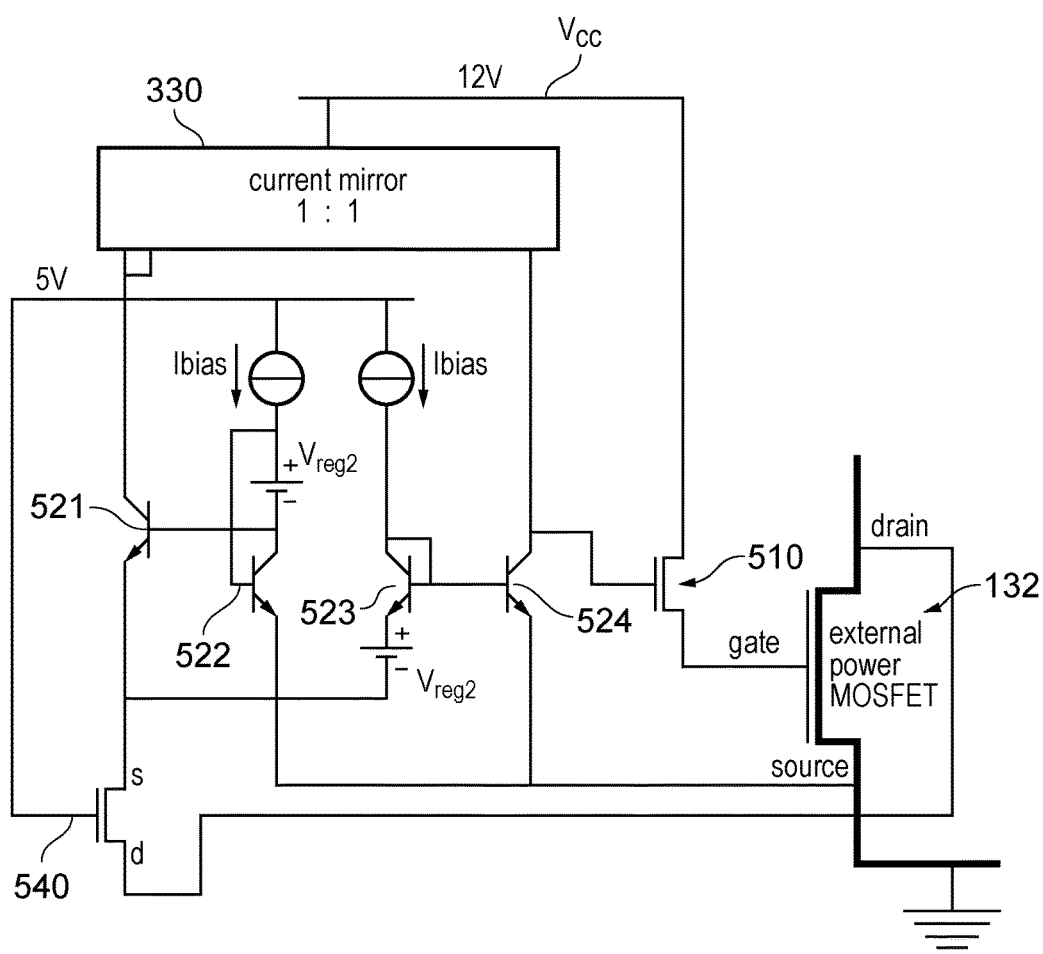
FIG. 5 shows a circuit diagram of a gate charger according to one more embodiments.

FIG. 5 shows a circuit diagram of a regulator for controlling a synchronous rectifier (or syncrec) MOSFET 132, such as may be used as the gate charger in the embodiment shown in FIG. 2. The skilled person will recognise that the circuit is substantially identical to that shown in FIG. 3 with reference to the first regulator, except that in this case the reference voltage for the regulation is Vreg2, which may typically be between 100 mV and 500 mV, and more particularly between 300 mV and 400 mV. The output from this regulator is provided at the gate of output charge-supplying transistor 510, which could also be used as the blanking signal for the normal regulator.

By providing a gate charger, it is possible to avoid the effects of the compromise which would be inevitably required were only the first regulator to be used—in particular, a regulator implemented as an amplifier comprising a feedback loop only has a single degree of freedom with regard to the gain of the amplifier: a higher gain may result in an improved response time of the regulator, but at the expense of the stability relative to a lower gain. The gain of the regulator is typically predetermined by the values of the components used in the regulator.

Figure 6A:
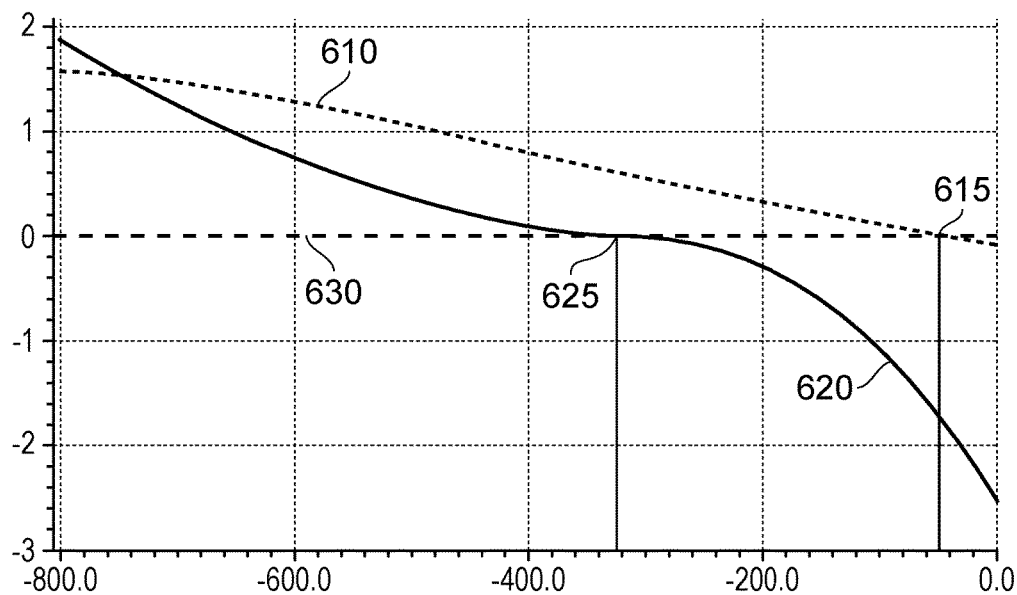
FIG. 6(a) illustrates currents hypothetically available at the output 216 of the trans-conductance amplifiers of regulator and gate charger as a function of their differential input voltage.

FIG. 6(a) illustrates an example of the current 610 that would be available at the output line 216 of the input stage or trans-conductance amplifier 214 of the first or normal regulator 210 and current 620 that is available at the output 226 of the input stage or trans-conductance amplifier 224 of the gate charger 220 as a function of their differential input voltage on the x-axis or abscissa, in the case both would stay active. The horizontal line 630 represents 0 current. So the currents above the line 630 indicate enabling currents and below it represent disabling currents. The curves 610 and 620 cross the zero line at their respective regulation voltage (Vref and Vreg2), which in this example are −50 mV and −330 mV respectively. Both curves 610 and 620 are exponential although the exponential coefficient of curve 610 is very small, and the curve approximates to a straight line, because it is limited by series resistances and/or limited current amplification factors. (Note that it still reaches a level of 1.6 mA, while its bias currents are only 25 uA.)

In one or more embodiments, first regulator is disabled by the gate charger when the latter develops positive currents, that is to say, at the regulation point 625. In FIG. 6(a) this is where the drain-source voltage becomes more negative than −330 mV.

Figure 6B:
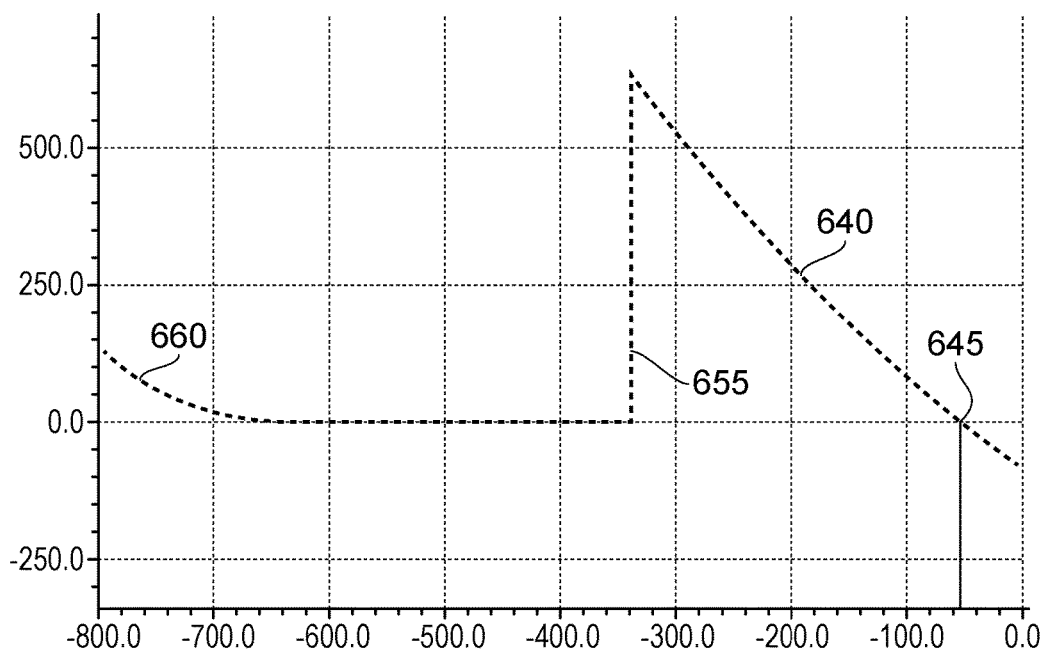
FIG. 6(b) illustrates the actual available current at the output of the input stage of the regulator, in one or more embodiments.

FIG. 6(b) shows the actual available current at the output of the input stage of the normal regulator, plotted against the differential input voltage on the x-axis. As shown, at zero differential voltage, the current is negative, but the current increases with increasingly negative input voltage, up to approximately −330 mV. This follows the plot 610 shown in FIG. 6(a): the current is zero at the regulation voltage of −50 mV shown at 645. The exponential nature of the increase is discernible in FIG. 6(b), due to the expanded scale of this plot compared with that in FIG. 6(a). At a negative differential input voltage of −330 mV, there is an abrupt change at 655 in the output current to 0. This is a result of the gate charger starting to provide current and thereby disabling the first regulator. At highly negative differential input voltages, more than approximately 650 mV, the first regulator is no longer disabled in the embodiment shown, and starts to provide a relatively small, but exponentially growing, current, shown at 660.

Figure 7:
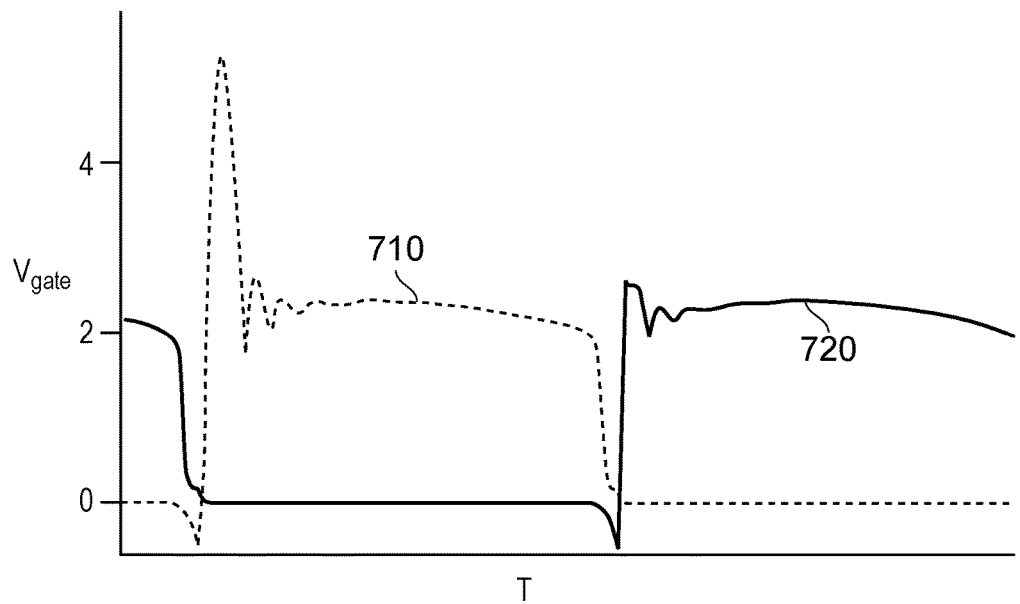
FIG. 7 is a graph comparing changes in gate voltage over time, for a controller including a gate charger, and not including a gate charger, for low current operation.

FIG. 7 shows the gate voltage for synchronous rectification, plotted against time T without the gate charger at 710 and with the gate charger at 720, for low current. In this example the peak current Ipeak=5 A. For plot 710, the syncrec MOSFET is conducting during the time interval corresponding to the left half of the figure, and blocking during the time interval corresponding to the right half of the figure; conversely, for plot 720, the syncrec MOSFET is conducting during the time interval corresponding to the right half of the figure, and blocking during the time interval corresponding to the left half of the figure.

For synchronous rectification without the gate charger the gate is charged to a high voltage, which is much higher that the threshold voltage, (and for instance may be around 6V as shown on 710) followed by discharging until the Vds regulation level has been reached. As shown, for low currents this increases the gate drive losses. For the synchronous rectification with gate charger the gate is monotonously charged and discharged according to the Vds regulation level and the gate drive losses are at or near a minimum and optimized level.

Figure 8:
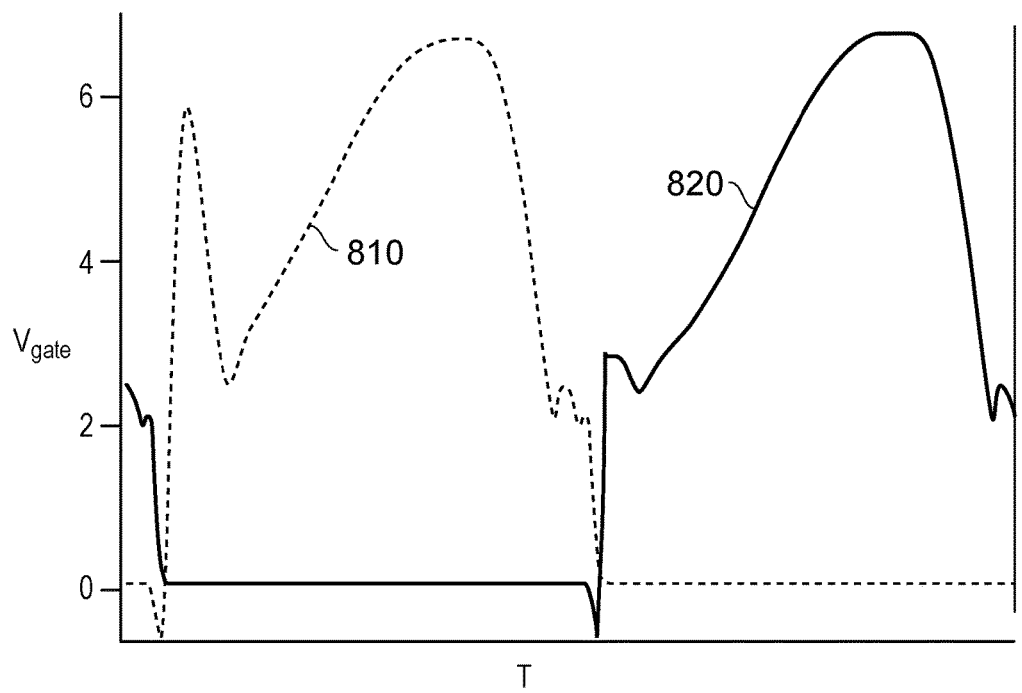
FIG. 8 is a graph comparing changes in gate voltage over time, for a controller including a gate charger, and not including a gate charger, for high current operation.

FIG. 8 shows the gate voltage for synchronous rectification, plotted against time T without the gate charger at 810 and with the gate charger at 820, for high current. In this example the peak current Ipeak=20 A. For plot 810, the syncrec MOSFET is conducting during the time interval corresponding to the left half of the figure, and blocking during the time interval corresponding to the right half of the figure; conversely, for plot 820, the syncrec MOSFET is conducting during the time interval corresponding to the right half of the figure, and blocking during the time interval corresponding to the left half of the figure. In this case, without the gate charger, charging of the gate to a high voltage followed by discharging until the Vds regulation level has been reached results in the gate being almost twice charged and discharged per cycle. Similarly to the low current case shown in FIG. 7, for the synchronous rectification with gate charger the gate is monotonously charged and discharged according to the Vds regulation level and the gate drive losses are at an optimized level. It will be observed that at higher peak current the gate is charged on purpose to a higher voltage, relative to that shown in FIG. 7—which in this case may be as high as 7V (see the positive slope of the voltage over a large part of the time interval)—to achieve lower conduction losses by a lower on-resistance of the syncrec MOSFET.

The skilled person will appreciate that the exact moment when the charging stops may depend on the size of the MOSFET: a very large MOSFET will be charged a little slower, such that there is more time to stop the charging. So it may stop the charging before the Vds regulation level of the first regulator is reached. A much smaller MOSFET is charged much faster, so there is less time to stop the charging and there will be some limited overshoot; even so, because the gate capacitance is much smaller, the extra gate drive losses may be expected to be more limited.

Although the converter shown in FIG. 1 is a resonant converter, embodiments are not limited to resonant converters, but may include other converters in which synchronous rectification is beneficial at the output side. Also, FIGS. 7 and 8 illustrate the behaviour of a resonant converter in particular, in which the currents are sinusoidal; the skilled person will recognise that the disclosure is not limited thereto—they are merely examples, which illustrate how it may be possible to avoid gate voltage overshoot, with the help of a gate charger.

Nonetheless, resonant converters are a particular appropriate application for one or more embodiments, since the currents have a sinusoidal shape and so are small at the start of the turn on phase:

In order to illustrate this, consider illustrative conventional synchronous rectification in which the syncrec MOSFET is switched on hard completely at the start of the conduction cycle, and after a minimum waiting period which is enough to give the gate driver the opportunity to fully charge the gate and wait for ringing to have dampened out sufficiently, the pull-up of the gate driver (by the switch being hard on) is switched off (that is to say, the switch is as least partly opened) and regulation is activated which regulates the gate such that a Vds regulation level is maintained. When the current is still small at the end of the switch on period, the gate will be regulated off almost completely. When subsequently the current increases to much higher levels, the gate has to be regulated on fast enough to maintain a constant Vds regulation level or until the current has reached its maximum or if the gate has reached its maximum gate drive level.

In the example case of a resonant converter the current could still be small at the end of the switch on period, after which the current will grow further until it reaches the top of the generally sinusoidal shape. In that case the gate of the MOSFET would have been switched on completely, and then first be almost regulated off, after which the regulator would quickly have to regulate the gate on again until the maximum current is reached.

So with resonant converters a controller according to one or more embodiments which is capable of charging the gate relatively fast but also in a stable manner to keep the Vds as close as possible to the regulation level may be beneficial. Charging and discharging of the gates in a monotonous way without significant over- or undershoots and ringing, may avoid unnecessary gate drive losses.

Consider next a fly back converter running at very low load, such that the current is not only smaller at the beginning, but immediately starts decreasing: it would not be desirable to first fully charge the gate—or even having to wait long enough to switch on fully, because in that case it might happen that the current reaches zero and even reverses direction during the switch on period. Thereafter, it would also take some time to regulate the MOSFET off, because it was charged on completely. Also during regulating the MOSFET off, the current through it would build up more in the wrong direction. This would lead to build up of energy in the wrong direction which might push the drain voltage up even past the breakdown voltage of the MOSFET. This could be prevented by clamping the voltage sufficiently strongly. But the stronger one has to clamp, the higher the power losses and inefficiencies. Controllers without initial fully switch on by means of a switch, but using an amplifier to regulate the MOSFET on, may mitigate such problems. In particular, combining a first regulation voltage with a second regulation voltage during a turn-on phase, such as are disclosed in one or more embodiments, may make it easier to prevent initial overshoot of the gate voltage of the MOSFET, which would lead to unnecessary gate drive losses and lower efficiency.

From reading the present disclosure, other variations and modifications will be apparent to the skilled person. Such variations and modifications may involve equivalent and other features which are already known in the art of synchronous rectification, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

LIST OF REFERENCE SIGNS

100 switch mode power converter
110 power MOSFET
111 power MOSFET
120 transformer
121 primary side winding
122 secondary side winding
123 secondary side winding
131 resonant tank capacitor
132 synchronous Rectification MOSFET
133 synchronous Rectification MOSFET
140 output capacitor
150 load 160 integrated circuit
162 controller
163 controller
202 protection switch
210 first regulator
212 voltage source
214 trans-conductance amplifier
216 output line
220 gate charger
220' gate charger
222 voltage source
224 trans-conductance amplifier
224' sub-controller
226 output line
226' switch
250 gate charge transistor
268 syncrec drain voltage line
270 syncrec source voltage line
310 gate charge MOSFET
321 bipolar transistor
322 bipolar transistor
323 bipolar transistor
324 bipolar transistor
330 current mirror
340 protection transistor
410 gate discharge MOSFET
421 bipolar transistor
422 bipolar transistor
423 bipolar transistor
424 bipolar transistor
430 current mirror
440 protection transistor
510 gate charge MOSFET
521 bipolar transistor
522 bipolar transistor
523 bipolar transistor
524 bipolar transistor
530 current mirror
540 protection transistor
610 first regulator charge and discharge enable current
615 first regulation point
620 gate charger charge enable current
625 second regulation point
630 zero current line
640 first regulation enable current
645 first regulation point
655 first regulator disable
660 first regulator enable current tail
710 syncrec gate voltage without gate charger, low current
720 syncrec gate voltage with gate charger, low current
810 syncrec gate voltage without gate charger, high current
820 syncrec gate voltage with gate charger, high current

The invention claimed is:

1. A controller configured to control the gate of a synchronous rectification MOSFET having a drain, a source and a gate;
the controller comprising a regulator configured to control the charge on the gate to regulate a voltage between the drain and the source to a first regulation voltage, and a gate charger configured to supply charge to the gate only during a turn-on phase of the synchronous rectification MOSFET operation,
wherein the gate charger is further configured to, when supplying charge, disable the regulator.

2. A controller as claimed in claim 1, wherein the gate charger is configured to supply charge to the gate to tend to regulate a voltage between the drain and the source to a second regulation voltage having a larger absolute value than the absolute value of the first regulation voltage.

3. A controller as claimed in claim 2, wherein the first regulation voltage is between 40 mV and 60 mV.

4. A controller as claimed in claim 3, wherein the second regulation voltage is between 300 mV and 400 mV.

5. A controller as claimed in claim 1, wherein the first regulation voltage is between 10 mV and 100 mV.

6. A controller as claimed in claim 1, wherein the second regulation voltage is between 100 mV and 500 mV.

7. A controller as claimed in claim 1, wherein the gate charger is operable only when a back gate diode of the synchronous rectification MOSFET is conducting.

8. A controller as claimed in claim 7, wherein the back gate diode starts to conduct at a voltage of 700 mV.

9. A controller as claimed in claim 1, wherein the controller is a controller for a switched mode power converter, and further comprises a power switch control unit configured to control the switching of a power switch of the switch mode power converter.

10. A controller as claimed in claim 9, wherein the power converter is a resonant converter.

11. A switch mode power converter comprising a power switch, a synchronous rectification MOSFET and a controller as claimed in claim 1, configured to control at least the synchronous rectification MOSFET.

12. A method of controlling a synchronous rectifier in a Switched Mode Power Converter, having a drain, a source and a gate, and incorporating a back gate diode,
the method comprising:
regulating a voltage between the drain and the source to a first regulation voltage by means of a first regulator;
regulating a voltage between the drain and the source to a second regulation voltage having a larger absolute value than the absolute value of the first regulation voltage during a turn-on phase of the synchronous rectification MOSFET operation, by means of a gate charger; and disabling the first regulator whenever the gate charger is in operation.

13. The method of claim 12, wherein regulation by the gate charger commences when a voltage between the gate and the source starts to exceed a forward turn-on voltage of a back gate diode of the MOSFET.

14. The method of claim 12, wherein tending to regulate the voltage between the drain and the source to a first regulation voltage comprises tending to regulate the voltage to a voltage which is between −40 mV and −60 mV.

15. The method according to claim 12, wherein regulating the voltage between the drain and the source to a second regulation voltage comprises regulating the voltage to between −300 mV and −400 mV.

* * * * *